United States Patent [19]

Freyre

[11] 4,390,247
[45] Jun. 28, 1983

[54] CONTINUOUSLY VARIABLE DELAY LINE
[75] Inventor: Frederick W. Freyre, Wantagh, N.Y.
[73] Assignee: Hazeltine Corporation, Greenlawn, N.Y.
[21] Appl. No.: 274,561
[22] Filed: Jun. 17, 1981
[51] Int. Cl.³ .............................................. G02F 1/11
[52] U.S. Cl. .................................... 350/358; 372/700
[58] Field of Search ........................ 350/358; 364/827
[56] References Cited
U.S. PATENT DOCUMENTS 4,012,120  3/1977  Kagiwada et al. ................. 364/827
4,365,310 12/1982  Green ................................ 364/827

Primary Examiner—William L. Sikes
Assistant Examiner—Léon Scott, Jr.
Attorney, Agent, or Firm—E. A. Onders; F. R. Agovino

[57] ABSTRACT

Coherent light is incident upon an acousto-optical cell through which bulk acoustic waves are propagating. These acoustic waves correspond to a signal to be delayed and result from the application of the signal to a piezoelectric transducer of the cell. The waves cause periodic variations in the refractive index of the cell which interact with the coherent light. Acoustic frequency components of the propagating waves correspond to the signal frequency components and cause the cell to diffract the beam of incident coherent light and to frequency shift the diffracted beam. The relative phases of the acoustic frequency components of the acoustic waves also correspond to the phases of the frequency components of the signal to be delayed and are imparted to the respective diffracted light beams. The diffracted light is combined with undiffracted coherent light so that optical heterodyning takes place. The recombined light is focused by a Fourier transform lens onto a photomixer which detects the frequency difference between the diffracted and undiffracted light beams. This detected frequency difference corresponds to the signal to be delayed. The delay time is the time required to convert the signal to corresponding acoustic waves and to optically detect the waves. The delay time is equal to the time required for the acoustic waves to propagate from the transducer to the point of incidence of the coherent light on the cell. Deflecting the coherent light incident upon the acousto-optical cell varies the point of incidence on the cell and, therefore, the delay time.

14 Claims, 3 Drawing Figures

CONTINUOUSLY VARIABLE DELAY LINE

BACKGROUND OF THE INVENTION

1. Field of the Invention

The invention relates generally to optical heterodyning systems and, in particular, to a continuously variable delay line employing an acousto-optical cell and a beam translator such as disclosed in Ser. No. 274,576 filed concurrently herewith and incorporated herein by reference.

2. Description of the Prior Art

Optical heterodyning is known in the prior art. For example, U.S. Pat. No. 4,097,110 describes deep polarization measurement by optical heterodyning. A signal component polarized in one direction and a frequency shifted local oscillator component polarized in the same direction are formed from signal and reference components, respectively, of an incident beam. These components are optically heterodyned at a detector.

SUMMARY OF THE INVENTION

It is an object of this invention to provide an apparatus for delaying a signal, the apparatus permitting continuously variable control of the delay time.

It is another object of this invention to provide a signal delay line which employs an acousto-optical cell.

The invention comprises apparatus for delaying an RF signal. An acousto-optical cell having a transducer and an absorber has the RF signal applied to the transducer. A source of coherent light providing an output beam is incident upon the acousto-optical cell at an acousto-optical angle of the cell. Means for deflecting the output beam of the source of coherent light is provided. The frequency difference between the output beam and light transmitted through said cell is detected by focusing these beams with a Fourier Transform element onto a means for detecting.

For a better understanding of the present invention, together with other and further objects, reference is made to the following description, taken in conjunction with the accompanying drawings, and its scope will be pointed out in the appended claims.

DETAILED DESCRIPTION OF THE INVENTION

Figure 1:
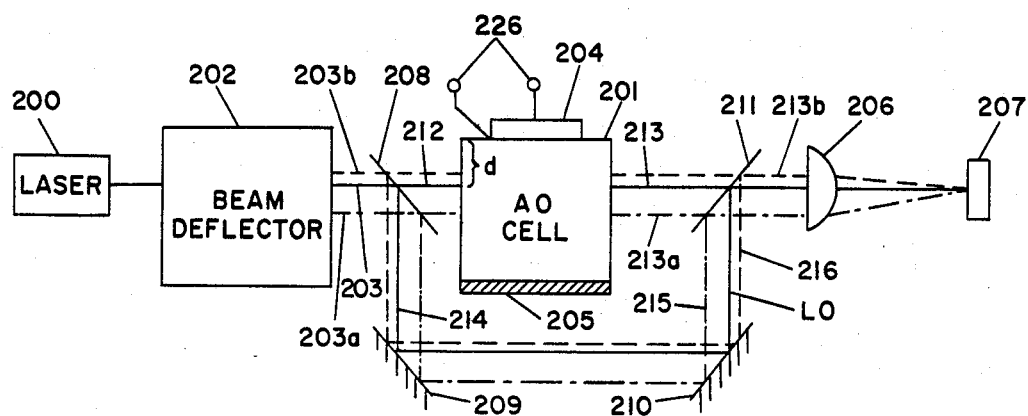
FIG. 1 illustrates a continuously variable acousto-optical delay line according to the invention.

FIG. 1 illustrates a preferred embodiment of the invention wherein optical heterodyning is employed to effect a continuously variable delay. A coherent light source, such as laser 200, provides a light beam 203 which is incident on an acousto-optical cell, such as Bragg cell 201, at the acousto-optical (Bragg) angle $\theta_B$. Beam deflector 202 controls the point of incidence 212 on cell 201 of the incident light beam 203. Deflector 202 may be any known system for translating a beam of light such as the apparatus illustrated in copending application Ser. No. 274,576 filed concurrently herewith.

Figure 2:
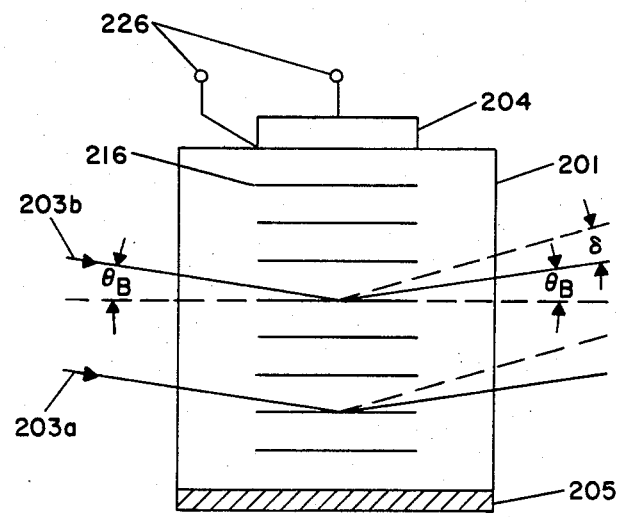
FIG. 2 illustrates diffraction by the acousto-optical cell of FIG. 1.

Cell 201 includes a transducer 204 and an absorber 205. Acousto-optical diffraction, as illustrated in FIG. 2, employs a high interaction efficiency Bragg technique where the diffraction angle $\theta_d$ varies with the RF frequency f as follows:

$$\theta_d = \theta_B \pm \delta$$

where $$\delta = (\lambda/V_a) \Delta f; \sin \theta_B = (\lambda/2 V_a)f$$

$V_a$ = velocity of propagation of acoustic waves through the Bragg cell
$\lambda$ = wavelength of incident light An RF signal to be delayed is applied to transducer 204 via terminals 226. Application of an RF signal to transducer 204 results in acoustic waves 216 being launched through the medium of cell 201 and finally absorbed by absorber 205. These acoustic waves 216 correspond to the signal to be delayed and cause periodic variations in the refractive index of cell 201 which interact with incident light beam 203. (Light entering and exiting cell 201 is also refracted but such refraction is not shown for simplification.) Acoustic frequency components of the propagating waves correspond to the signal frequency components and cause the cell to diffract the beams of incident coherent light and to frequency shift the diffracted beams. The relative phases of the acoustic frequency components of the acoustic waves also correspond to the phases of the frequency components of the signal to be delayed and are imparted to the respective diffracted light beams.

A Fourier Transform element such as a spherical mirror or lens 206 focuses light 213 diffracted by angular amount $\theta_d$ through cell 201 onto photomixer 207. Simultaneously, beam splitter 208 reflects a beam 214 of coherent light toward mirrors 209 and 210 to form a reference beam LO which is equivalent to the output of a reference local oscillator. The LO beam is recombined with the diffracted light 213 by beam splitter 211. The recombined LO beam and deflected light 214 pass through Fourier Transform lens 206 and are focused on photomixer 207. As a result, heterodyning takes place and the output of photomixer 207 is proportional to the difference frequency between the diffracted beam and undiffracted LO beam which are superimposed highly parallel to each other.

By controlling the point of incidence 212 of the coherent light 203 on acousto-optical cell 201, the delay time, i.e., the period from the time of application of the incoming RF signal to terminals 206 to the time of optical detection of the RF signal modulation component of light 213 by photomixer 207, is continuously variable. The delay time range is dependent upon the amount of beam deflection which may be achieved by beam deflector 202 and the propagation velocity of the bulk acoustic wave through the medium of cell 201. Since bulk acoustic waves are on the order of five times slower than electromagnetic waves, the maximum time delay which may be achieved by converting the RF signal to a bulk acoustic wave is significantly increased. Modulation of beam 203 by the bulk acoustic waves at a variable point along the length of cell 201 provides the mechanism by which a continuously variable delay can be introduced to the RF signal supplied to transducer 204, which is needed in such apparatus as radar and communication systems.

The actual delay time is approximately equal to the distance (d) between the transducer 204 and the point of incidence 212 divided by the velocity of propagation of the acoustic waves 216 in cell 201. Beam deflector 202 causes the position of incident beam 203 to change, thereby changing the point of incidence 212 on cell 201. By deflecting beam 203 downward, distance (d) may be increased, resulting in an increase in the delay time. Alternatively, deflecting beam 203 upward decreases distance (d), resulting in a decrease in the delay time.

Beam 214, reflected by beam splitter 208, functions as a local oscillator and may be reflected from incident beam 203 before or after deflection by beam deflector 202. Preferably, beam splitter 208 is located between beam deflector 202 and cell 201. In order to create proper heterodyning, the local oscillator beam LO should be combined with deflected beam 213 before focusing by Fourier Transform lens 206. By locating beam splitter 208 on one side of cell 201 and beam splitter 211 on the other side of cell 201, beam deflector 202 does not affect the recombination of the LO beam with the diffracted beam 213. For example, if incident beam 203 is deflected to position 203a by beam deflector 202, local oscillator beam LO is similarly deflected to position 215, at which point it is recombined by beam splitter 211 with diffracted beam 213a. Similarly, if incident beam 203 is deflected upward to position 203b by beam deflector 202, local oscillator LO is deflected to position 216 where it is recombined with diffracted beam 213b.

Figure 3:
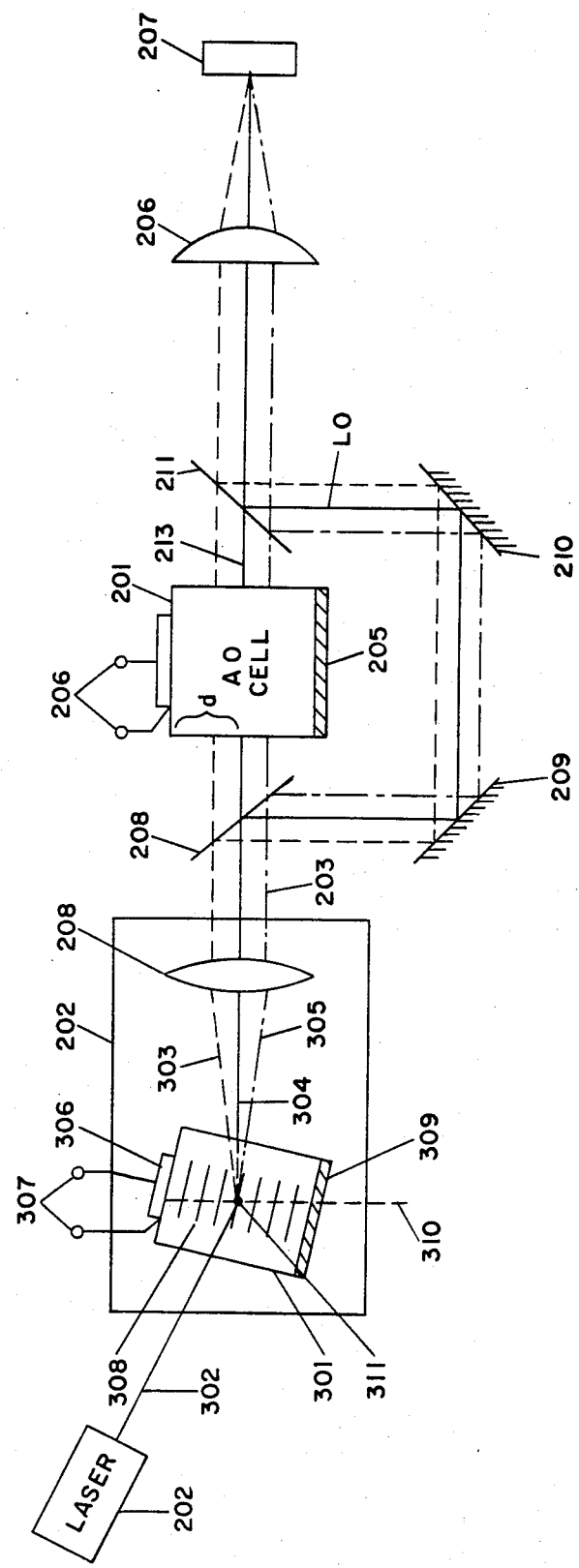
FIG. 3 illustrates a beam deflector in combination the delay line according to the invention.

FIG. 3 illustrates an acousto-optical beam deflector 202 as part of the delay line according to the invention wherein like reference numerals refer to similar structure. In particular, laser 200 provides coherent light which is incident on an acousto-optical cell such a Bragg cell 301 at an acousto-optical angle. Incident light 302 is diffracted, as represented by beams 303, 304, 305, depending on the frequency of the signal applied to transducer 306 via ports 307. An FT element such as lens 308 is positioned to refract beams 303, 304, 305 diffracted by cell 301 as parallel beams incident on cell 201 at an acousto-optical angle. Transducer 306 launches acoustic waves 308 through cell 301 which are absorbed by absorber 309. Waves 308 frequency shift incident light 302 by the frequency of the signal applied to ports 307. By controlling the frequency of the signal applied to ports 307, the amount of deflection of incident light 302 can be controlled so that the point of incidence as defined by distance d on cell 201 may be varied. The rear focal plane 310 of FT lens 308 intersects the center point 311 of the diffracted beam with cell 306 so that all refracted beams 303, 304, 305 are parallel and incident on cell 301 at an acousto-optical angle.

While there have been described what are at present considered to be the preferred embodiments of this invention, it will be obvious to those skilled in the art that various changes and modifications may be made therein without departing from the invention and it is, therefore, aimed to cover all such changes and modifications as fall within the true spirit and scope of the invention.

I claim:

1. An apparatus for delaying a signal by a selected amount comprising:
   first means for converting a supplied signal into at least one corresponding acoustic wave propagating through a medium;
   second means for modulating a light beam with said acoustic wave at a given position in the medium;
   third means for detecting the modulation components of said light beam, thereby developing an output signal which corresponds to said supplied signal, but delayed with respect thereto; and
   fourth means for adjusting the location of the given position in the medium, thereby to control the amount of said delay.

2. The apparatus of claim 1 wherein said medium comprises an acousto-optical cell.

3. The apparatus of claim 2 wherein said first means comprises a transducer connected to said cell for converting the supplied signal into an acoustic wave propagating through said cell, and means for absorbing said waves after they have traversed said cell.

4. The apparatus of claim 3 wherein said second means comprises a source of coherent light providing a beam incident on said cell at an acousto-optical angle of said cell.

5. The apparatus of claim 4 wherein said third means comprises:
   means for combining light diffracted by said cell with reference light from said source;
   a Fourier Transform element for focusing light diffracted by said cell; and
   means for detecting said focused and combined light, thereby developing an output signal proportional to the difference frequency between the diffracted light and said reference light.

6. The apparatus of claim 5 wherein said fourth means comprises means for deflecting the beam of said source of coherent light.

7. The apparatus of claims 4 or 6 herein said means for detecting is a photomixer.

8. An apparatus for delaying an RF signal by a selected amount comprising:
   (a) a first acousto-optical cell having a transducer for converting the RF signal into an acoustic wave propagating through said cell and an absorber;
   (b) a source of coherent light providing an output beam incident on said cell at a given angle;
   (c) means for deflecting the output beam of said source of coherent light;
   (d) a Fourier Transform element for focusing light diffracted by said cell;
   (e) means for combining the output beam of said source of coherent light and the diffracted light; and
   (f) means for detecting the frequency difference between the diffracted light focused by said element and the output beam.

9. The apparatus of claim 8 wherein said acousto-optical cell is a Bragg cell.

10. The apparatus of claim 9 wherein said source of coherent light is a laser.

11. The apparatus of claim 10 wherein said means for deflecting comprises a second acousto-optical cell.

12. The apparatus of claim 11 wherein said second acousto-optical cell has means associated therewith for refracting all beams diffracted by said second cell as parallel beams incident on said first cell at the given angle thereof.

13. The apparatus of claim 12 wherein said means for detecting is a photomixer.

14. The apparatus of claim 13 wherein said means for combining combines the output beam and the light diffracted by said cell before said element so that said element focuses the combined output beam and the light diffracted by said cell onto said photomixer.

* * * * *